United States Patent
Sung et al.

(10) Patent No.: US 11,373,701 B2
(45) Date of Patent: Jun. 28, 2022

(54) SEMICONDUCTOR DEVICE

(71) Applicant: SK hynix Inc., Icheon-si (KR)

(72) Inventors: Sang Hyun Sung, Icheon-si (KR); Sung Lae Oh, Icheon-si (KR); Je Hyun Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/171,632

(22) Filed: Feb. 9, 2021

(65) Prior Publication Data

US 2022/0139449 A1    May 5, 2022

(30) Foreign Application Priority Data

Oct. 29, 2020 (KR) .................. 10-2020-0141856

(51) Int. Cl.
 *G11C 5/06* (2006.01)
 *G11C 11/417* (2006.01)
 *G11C 11/412* (2006.01)
 *H01L 27/11* (2006.01)
 *H01L 23/00* (2006.01)

(52) U.S. Cl.
 CPC .......... *G11C 11/417* (2013.01); *G11C 11/412* (2013.01); *H01L 24/06* (2013.01); *H01L 24/49* (2013.01); *H01L 27/1104* (2013.01)

(58) Field of Classification Search
 CPC ..... G11C 11/417; G11C 11/412; H01L 24/06; H01L 24/49; H01L 27/1104

USPC ..................................................... 365/230.06
See application file for complete search history.

(56) References Cited

U.S. PATENT DOCUMENTS

| 7,829,983 | B2 | 11/2010 | Yamada et al. |
| 9,711,224 | B2* | 7/2017 | Tanzawa ............... G11C 5/025 |
| 9,953,965 | B2* | 4/2018 | Park ....................... H01L 24/73 |
| 10,366,727 | B2* | 7/2019 | Seo ........................ H01L 23/544 |
| 2020/0395341 | A1* | 12/2020 | Maejima ........... H01L 27/11573 |

FOREIGN PATENT DOCUMENTS

| JP | 4879899 B2 | 12/2011 |
| JP | 2019-057532 A | 4/2019 |

\* cited by examiner

*Primary Examiner* — Viet Q Nguyen

(57) ABSTRACT

A semiconductor device includes a first wafer including a row decoder region in which a plurality of pass transistors are arranged in a row direction and a column direction; a plurality of first bonding pads, respectively coupled to the plurality of pass transistors that are disposed in a plurality of rows on one surface of the first wafer in the row decoder region; and a plurality of second bonding pads disposed on the one surface of the first wafer in the row decoder region, wherein the plurality of second bonding pads are disposed in a different row from the plurality of first bonding pads and are offset in the row direction with respect to the plurality of first bonding pads.

20 Claims, 10 Drawing Sheets

SEMICONDUCTOR DEVICE

CROSS-REFERENCE TO RELATED APPLICATION

The present application claims priority under 35 U.S.C. § 119(a) to Korean Patent Application No. 10-2020-0141856 filed in the Korean Intellectual Property Office on Oct. 29, 2020, which is incorporated herein by reference in its entirety.

BACKGROUND

1. Technical Field

Various embodiments generally relate to a semiconductor technology, and particularly, to a semiconductor device using a wafer bonding technique.

2. Related Art

As a measure for increasing the degree of integration, a technology has been disclosed in the art, in which a memory cell array and a logic circuit for controlling the memory cell array are separated and fabricated on a cell wafer and a peripheral wafer, respectively, and then the cell wafer and the peripheral wafer are bonded to each other by using a wafer bonding technique to form a semiconductor device.

In the semiconductor device using such a wafer bonding technique, bonding pads of the cell wafer and bonding pads of the peripheral wafer are overlapped and bonded, thereby electrically coupling the memory cell array and the logic circuit.

SUMMARY

Various embodiments are directed to a semiconductor device with reduced pad bonding failures.

Various embodiments are directed to a semiconductor device with a reduced size thereof.

In an embodiment, a semiconductor device may include: a first wafer including a row decoder region in which a plurality of pass transistors are arranged in a row direction and a column direction; a plurality of first bonding pads, respectively coupled to the plurality of pass transistors that are disposed in a plurality of rows on one surface of the first wafer in the row decoder region; and a plurality of second bonding pads disposed on the one surface of the first wafer in the row decoder region, wherein the plurality of second bonding pads are disposed in a different row from the plurality of first bonding pads and are offset in the row direction with respect to the plurality of first bonding pads.

In an embodiment, a semiconductor device may include: a cell wafer including a memory cell array, which is defined in a cell region, and a plurality of electrode layers that are stacked one upon another in a vertical direction, that are coupled to the memory cell array, and that extend to a row decoder region from the cell region; a plurality of first bonding pads disposed on one surface of the cell wafer in the row decoder region, and coupled to the plurality of electrode layers, respectively; a plurality of second bonding pads disposed on the one surface of the cell wafer in the row decoder region; a wiring line disposed to be spaced apart from the second bonding pads in the vertical direction, with the plurality of electrode layers interposed therebetween; and a plurality of vertical contacts, disposed in the row decoder region, that couples the plurality of second bonding pads and the wiring line.

Figure 5:
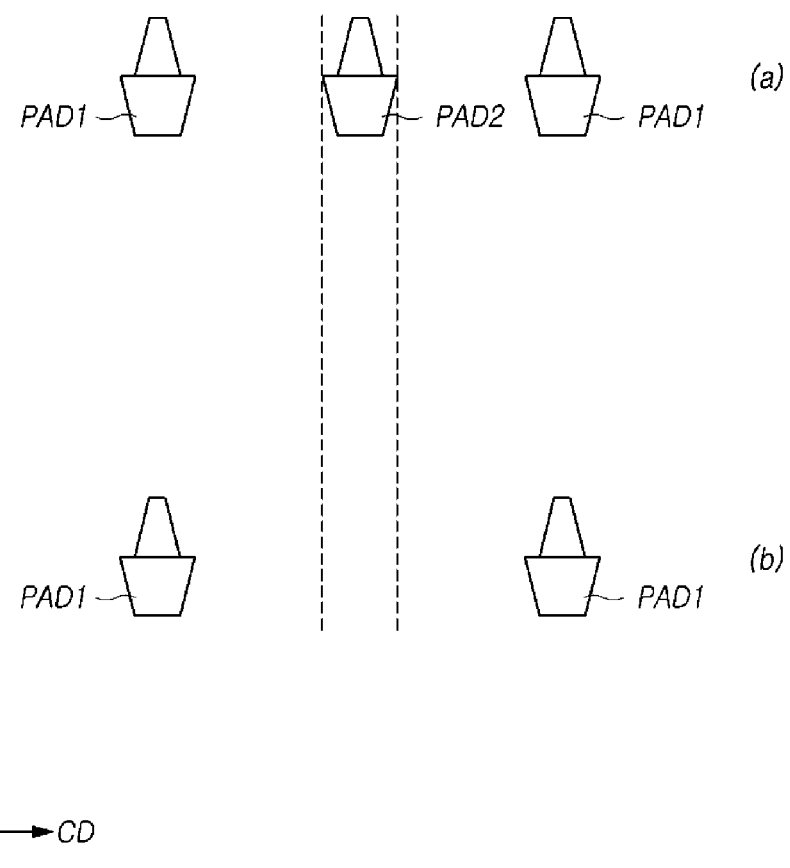

Part (a) of FIG. 5 is a diagram illustrating a column-directional layout structure of bonding pads that is different compared to an embodiment of the disclosure, and part (b) of FIG. 5 is a diagram illustrating a column-directional layout structure of bonding pads in accordance with an embodiment of the disclosure.

Figure 6:
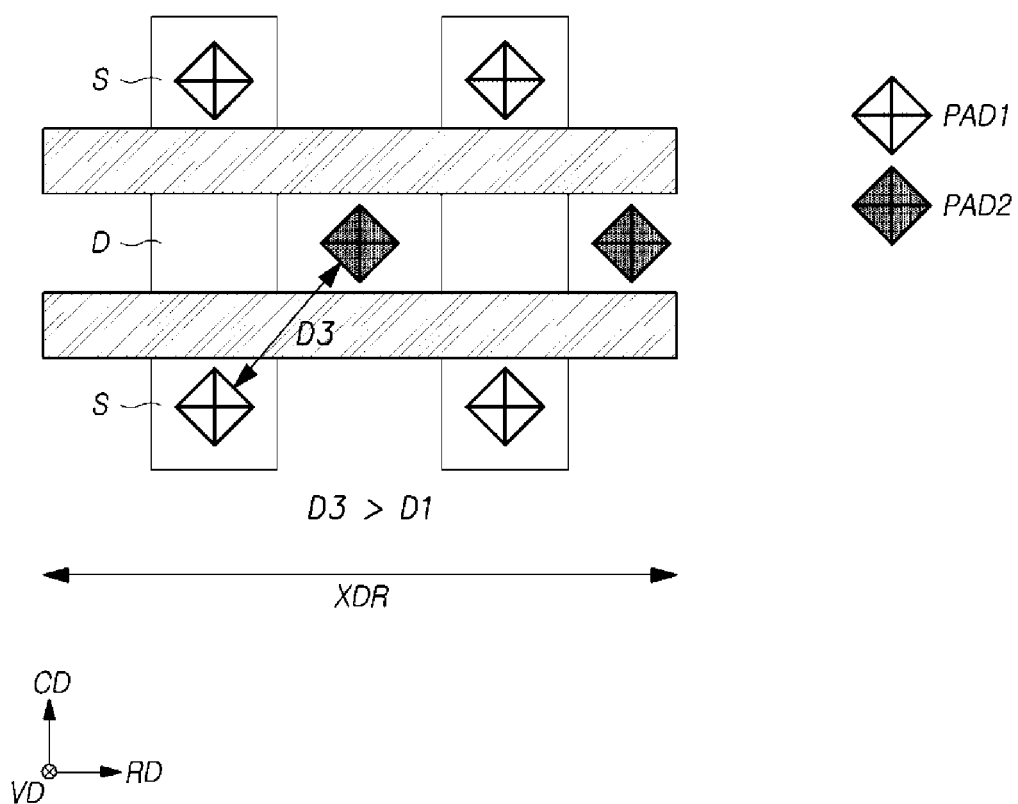

FIG. 6 is a layout diagram illustrating pass transistors and bonding pads in accordance with another embodiment of the disclosure.

Figure 7:
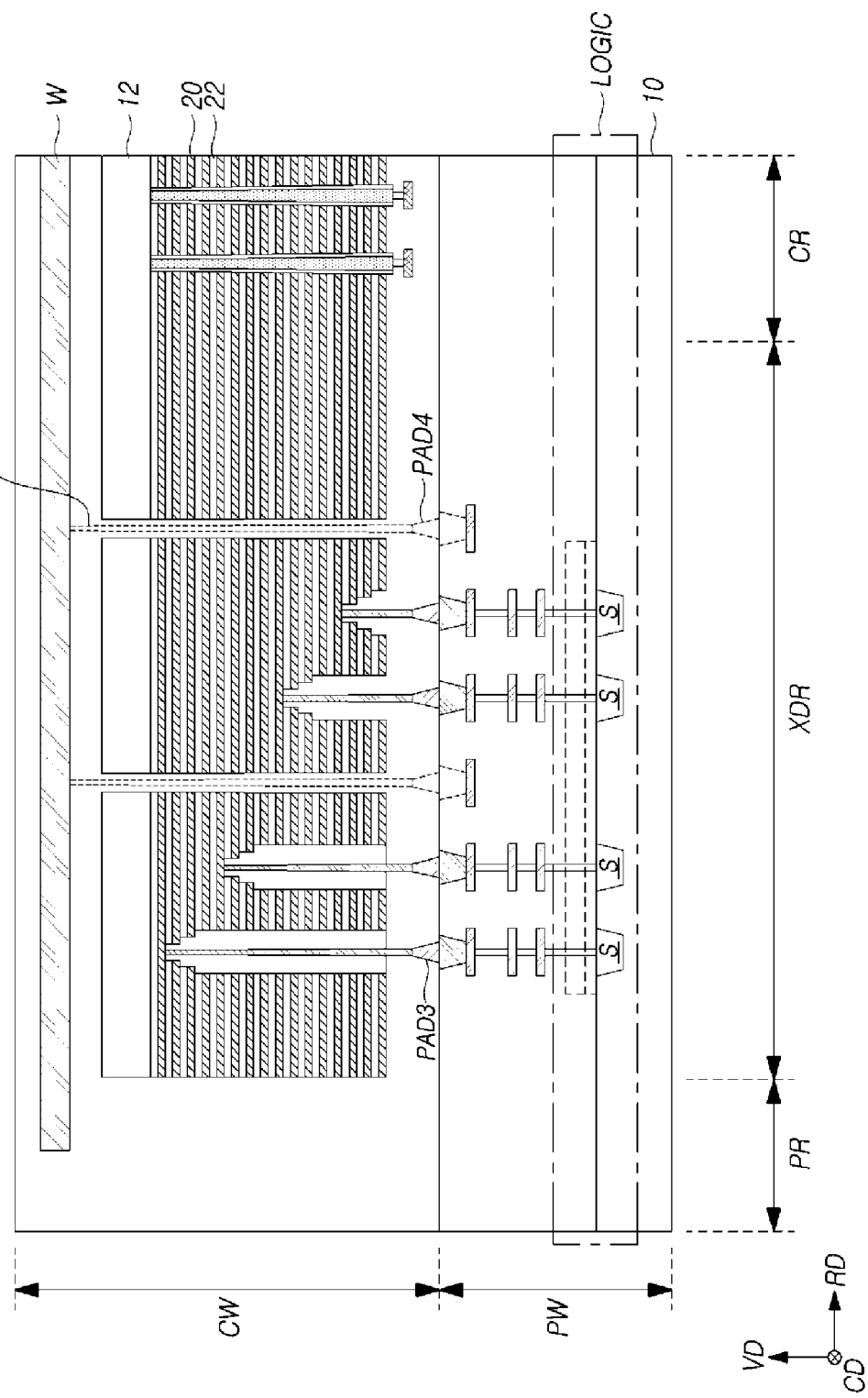

FIG. 7 is a cross-sectional view illustrating a semiconductor device in accordance with another embodiment of the disclosure.

Figure 8:
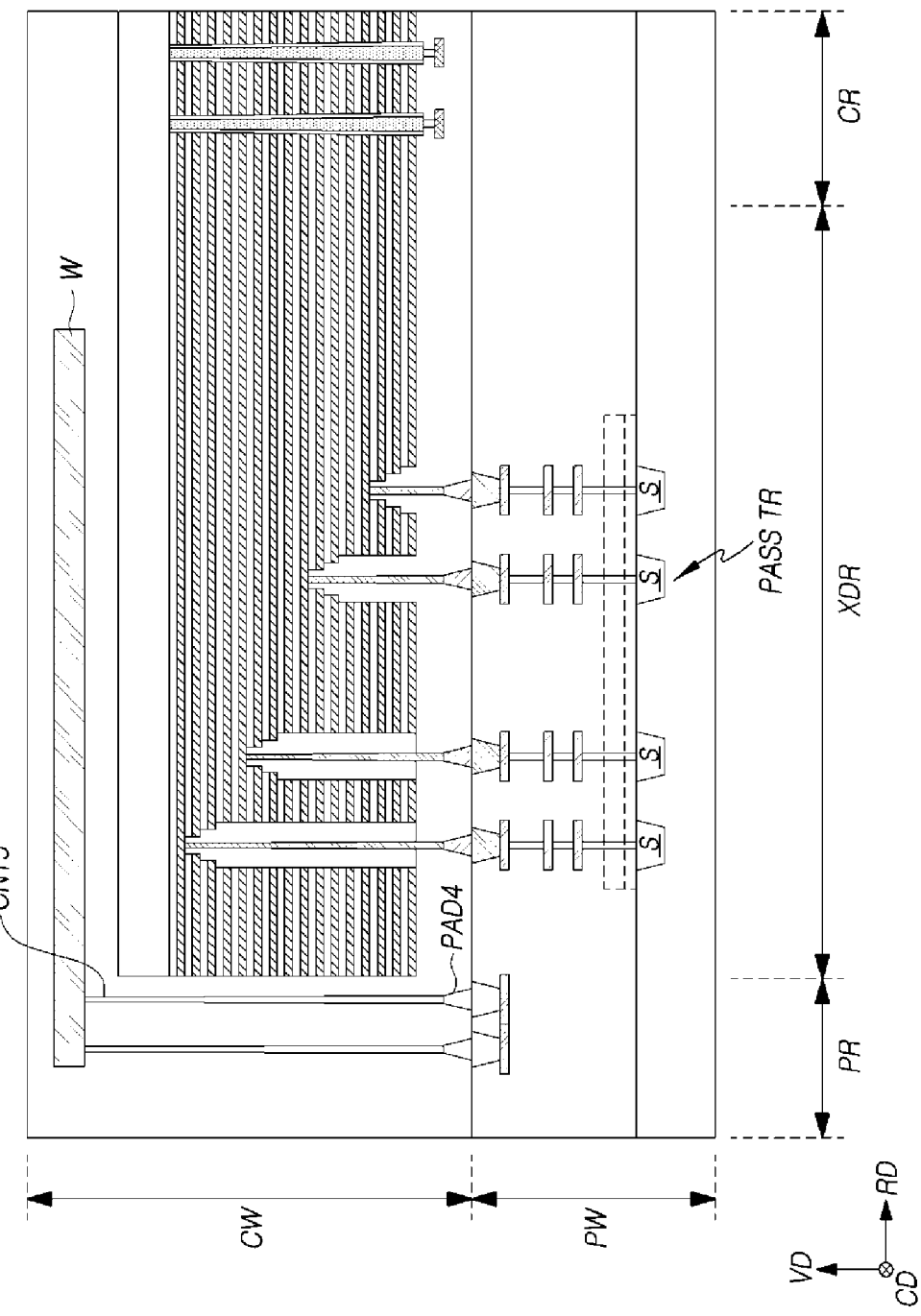

FIG. 8 is a cross-sectional view illustrating a layout of bonding pads and vertical contacts different from that in accordance with an embodiment of the disclosure.

Figure 9:
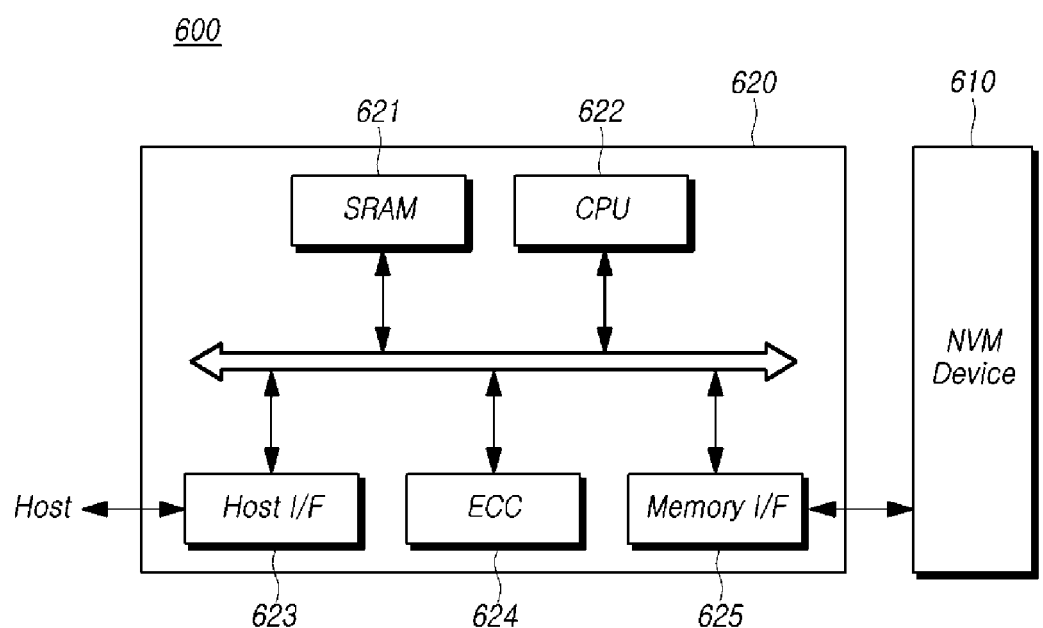

FIG. 9 is a block diagram schematically illustrating a memory system including a semiconductor device in accordance with an embodiment of the disclosure.

Figure 10:
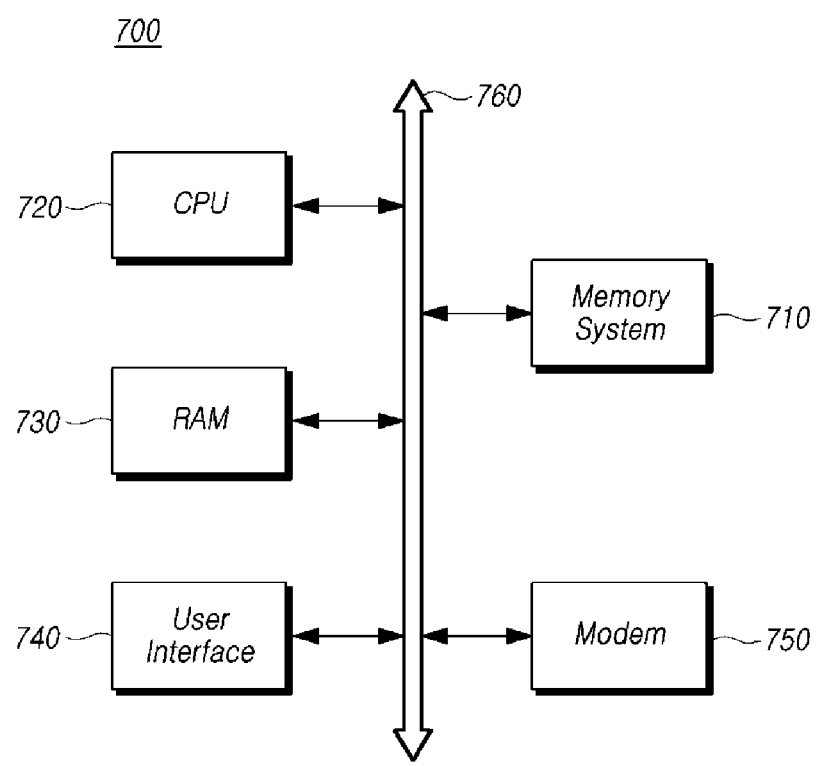

FIG. 10 is a block diagram schematically illustrating a computing system including a semiconductor device in accordance with an embodiment of the disclosure.

DETAILED DESCRIPTION

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

Because the figures, dimensions, ratios, angles, numbers of elements given in the drawings that describe embodiments of the disclosure are merely illustrative, the present disclosure is not limited to the illustrated matters. Throughout the specification, like reference numerals refer to like components. In describing the disclosure, when it is determined that a detailed description of the related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article (e.g., "a," "an" or "the") is used when referring to a singular noun, the article may include a plural of that noun unless specifically stated otherwise.

In interpreting elements in embodiments of the disclosure, they should be interpreted as including error margins even in the absence of explicit statements.

Also, in describing the components of the disclosure, there may be used terms such as first, second, A, B, (a), and (b). These are solely for the purpose of differentiating one component from another component and do not limit the substances, order, sequence or number of the components. Also, components in embodiments of the disclosure are not limited by these terms. These terms are used to merely distinguish one component from another component. Accordingly, as used herein, a first component may be a second component within the technical spirit of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element B" and "an element A next to an element B," one or more other elements may be disposed between the elements A and B unless the term "directly" or "immediately" is explicitly used.

Features of various exemplary embodiments of the disclosure may be coupled, combined or separated partially or totally. Technically various interactions and operations are possible. Various exemplary embodiments can be practiced individually or in combination.

Hereinafter, various examples of embodiments of the disclosure will be described in detail with reference to the accompanying drawings.

Figure 1:
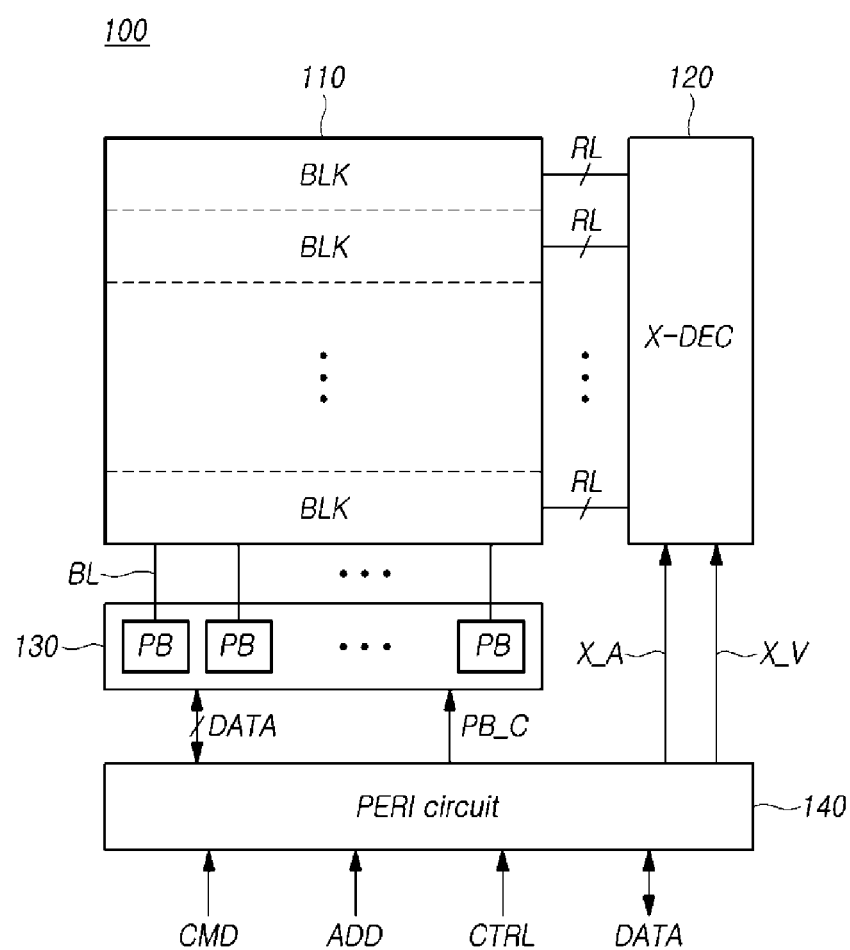
FIG. 1 is a block diagram schematically illustrating a semiconductor device in accordance with an embodiment of the disclosure.

FIG. 1 is a block diagram schematically illustrating a semiconductor device in accordance with an embodiment of the disclosure.

Referring to FIG. 1, a semiconductor device 100 in accordance with an embodiment of the disclosure may include a memory cell array 110, a row decoder (X-DEC) 120, a page buffer circuit 130 and a peripheral circuit 140.

The memory cell array 110 may include a plurality of memory blocks BLK. Although not illustrated, each of the memory blocks BLK may include a plurality of memory cells. The memory cell may be a volatile memory cell, which loses data stored therein in the case where power supply is interrupted, or may be a nonvolatile memory cell, which retains data stored therein even though power supply is interrupted. While it is described below that the semiconductor device 100 is a vertical type NAND flash device, it is to be noted that the technical spirit of the disclosure is not limited thereto.

The row decoder (X-DEC) 120 may be coupled to the memory cell array 110 through row lines RL. The row lines RL may include at least one drain select line, a plurality of word lines and at least one source select line. The row decoder (X-DEC) 120 may select one from among the memory blocks BLK of the memory cell array 110 according to address information. The row decoder (X-DEC) 120 may transfer an operating voltage X_V from the peripheral circuit 140, for example, a program voltage, a pass voltage or a read voltage, to the row lines RL coupled to a selected memory block BLK. In order to transfer the operating voltage X_V, the row decoder (X-DEC) 120 may include a plurality of pass transistors that are coupled to the row lines RL, respectively.

The page buffer circuit 130 may be coupled to the memory cell array 110 through bit lines BL. The page buffer circuit 130 may include a plurality of page buffers PB, which are coupled to the bit lines BL, respectively. The page buffer circuit 130 may receive a page buffer control signal PB_C from the peripheral circuit 140, and may transmit and receive a data signal DATA to and from the peripheral circuit 140.

The page buffer circuit 130 may control the bit line BL, which is coupled to the memory cell array 110, in response to the page buffer control signal PB_C. For example, the page buffer circuit 130 may detect data, stored in a memory cell of the memory cell array 110, by sensing the signal of a bit line BL of the memory cell array 110 in response to the page buffer control signal PB_C, and may transmit the data signal DATA to the peripheral circuit 140 depending on the detected data. The page buffer circuit 130 may apply a signal to the bit line BL based on the data signal DATA received from the peripheral circuit 140 in response to the page buffer control signal PB_C, and thereby, may write data in a memory cell of the memory cell array 110. The page buffer circuit 130 may write data in or read data from a memory cell that is coupled to a word line activated by the row decoder (X-DEC) 120.

The peripheral circuit 140 may receive a command signal CMD, an address signal ADD and a control signal CTRL from outside the semiconductor device 100, and may transmit and receive data DATA to and from a device outside the semiconductor device 100, for example, a memory controller. The peripheral circuit 140 may output signals for writing data DATA in the memory cell array 110 or reading data DATA from the memory cell array 110, for example, a row address X_A, the page buffer control signal PB_C and so forth, based on the command signal CMD, the address signal ADD and the control signal CTRL. The peripheral circuit 140 may generate various voltages including the operating voltage X_V, which are required in the semiconductor device 100.

Figure 2:
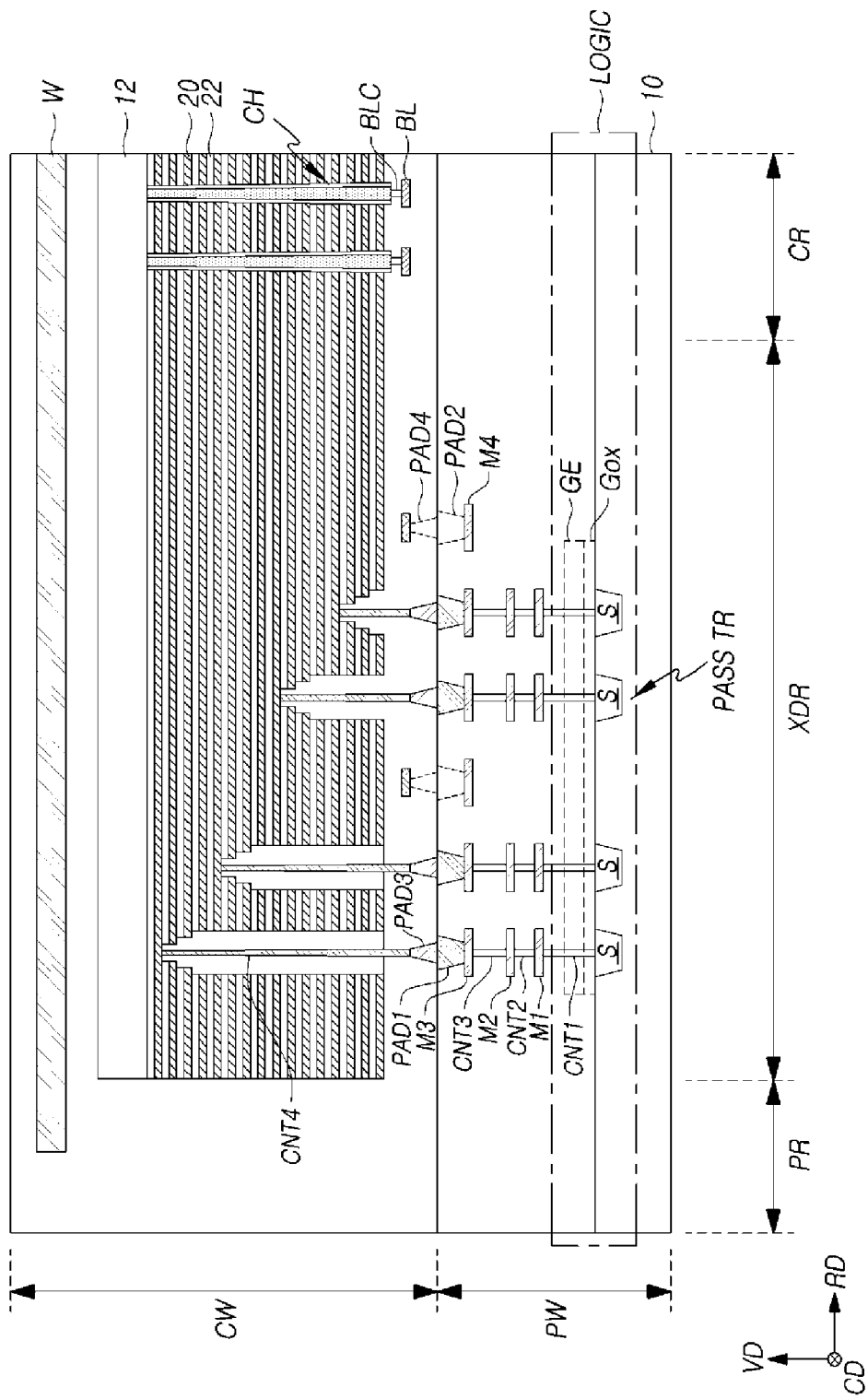
FIG. 2 is a cross-sectional view illustrating a semiconductor device in accordance with an embodiment of the disclosure.

FIG. 2 is a cross-sectional view illustrating a semiconductor device in accordance with an embodiment of the disclosure.

Referring to FIG. 2, a semiconductor device in accordance with an embodiment of the disclosure may include a peripheral wafer PW and a cell wafer CW that is bonded onto the peripheral wafer PW. The cell wafer CW and the peripheral wafer PW may be separately fabricated, and then may be bonded to each other by a bonding technique and coupled into one body.

The peripheral wafer PW may include a substrate 10 and a logic circuit LOGIC, which is defined in the substrate 10.

The substrate 10 may be a monocrystalline semiconductor film. For example, the substrate 10 may be a bulk silicon substrate, a silicon-on-insulator substrate, a germanium substrate, a germanium-on-insulator substrate, a silicon-germanium substrate, or an epitaxial thin film formed through selective epitaxial growth. The substrate 10 or/and the semiconductor device may include a cell region CR, a row decoder region XDR and a peripheral region PR.

The logic circuit LOGIC may include a plurality of pass transistors PASS TR. Although not illustrated, the logic circuit LOGIC may further include a page buffer circuit (130 of FIG. 1), a peripheral circuit (140 of FIG. 1), and a circuit (e.g., a block switch circuit) that configures a row decoder (120 of FIG. 1), in addition to the plurality of pass transistors PASS TR.

The plurality of pass transistors PASS TR may be disposed in the row decoder region XDR of the substrate 10. Each of the pass transistors PASS TR may include a gate dielectric layer Gox that is disposed on the substrate 10, a gate line GE that is disposed on the gate dielectric layer Gox, and a source region S, which is defined in an active region of the substrate 10 on one side of the gate line GE. Although not illustrated, a drain region of the pass transistor PASS TR may be formed in the active region of the substrate 10 on the other side of the gate line GE, and is opposite to the source region S. The gate dielectric layer Gox and the gate line GE are illustrated in FIG. 2 in order to facilitate understanding, and are shown by dotted lines to indicate that they do not exist on the cross-section of FIG. 2.

In the row decoder region XDR, a plurality of first bonding pads PAD1 and a plurality of second bonding pads PAD2 may be disposed on one surface of the peripheral wafer PW, which is bonded to the cell wafer CW.

Each of the first bonding pads PAD1 may be coupled to a corresponding pass transistor PASS TR through contacts CNT1 to CNT3 and wiring lines M1 to M3. An operating voltage from the pass transistor PASS TR may be transferred to the first bonding pad PAD1 through the contacts CNT1 to CNT3 and the wiring lines M1 to M3, and may be provided to the cell wafer CW through the first bonding pad PAD1.

The peripheral wafer PW may be provided with a power voltage from the cell wafer CW through the second bonding pads PAD2, and the second bonding pads PAD2 may correspond to power pads for receiving the power voltage. Each of the second bonding pads PAD2 may be coupled to a wiring line M4, and may be coupled to the logic circuit LOGIC through contacts and wiring lines (not illustrated) that are coupled to the wiring line M4. The power voltage provided to the second bonding pads PAD2 from the cell wafer CW may be transferred to the logic circuit LOGIC through wiring lines M4 and unillustrated contacts and wiring lines.

The cell wafer CW may include a source plate 12, and a plurality of electrode layers 20 and a plurality of interlayer dielectric layers 22, which are alternately stacked on the bottom surface of the source plate 12.

The source plate 12 may include a semiconductor material, for example, a group IV semiconductor, a group III-V compound semiconductor or a group II-VI compound semiconductor. For example, the group IV semiconductor may include silicon, germanium or silicon-germanium. For example, the source plate 12 may be provided as a polycrystalline layer or an epitaxial layer.

The electrode layers 20 may configure row lines (RL of FIG. 1). In detail, among the electrode layers 20, at least one electrode layer 20 from the uppermost electrode layer 20 may configure a source select line, and at least one electrode layer 20 from the lowermost electrode layer 20 may configure a drain select line. The electrode layers 20 between the source select line and the drain select line may configure word lines. In the row decoder region XDR, each of the electrode layers 20 may have a pad region exposed by another electrode layer 20 positioned thereunder, and some of such pad regions are illustrated in FIG. 2.

In the cell region CR, a plurality of vertical channels CH may be defined to pass, in a vertical direction VD, through the plurality of electrode layers 20 and the plurality of interlayer dielectric layers 22 that are alternately stacked. While not illustrated in detail, each of the vertical channels CH may include a channel layer and a gate dielectric layer. The channel layer may include polysilicon or monocrystalline silicon, and may include, in some regions thereof, a p-type impurity such as boron (B). The gate dielectric layer may have a shape that surrounds the outer wall of the channel layer. The gate dielectric layer may include a tunnel dielectric layer, a charge storage layer and a blocking layer that are sequentially stacked from the outer wall of the channel layer. In some embodiments, the gate dielectric layer may have an ONO (oxide-nitride-oxide) stack structure in which an oxide layer, a nitride layer and an oxide layer are sequentially stacked.

A source select transistor may be configured in areas or regions where the source select line surrounds the vertical channel CH. A memory cell may be configured in areas or regions where the word line surrounds the vertical channel CH. A drain select transistor may be configured in areas or regions where the drain select line surrounds the vertical channel CH. A source select transistor, a plurality of memory cells and a drain select transistor, which are disposed along one vertical channel CH, may configure one cell string.

A plurality of bit lines BL may be disposed below a stack including the plurality of electrode layers 20 and the plurality of interlayer dielectric layers 22. The bit lines BL may extend in a column direction CD, and may be arranged in a row direction RD. Each of the bit lines BL may be coupled to a corresponding vertical channel CH through a bit line contact BLC.

In the row decoder region XDR, a plurality of third bonding pads PAD3 and a plurality of fourth bonding pads PAD4 may be disposed on one surface of the cell wafer CW, which is bonded to the peripheral wafer PW.

The plurality of third bonding pads PAD3 may be configured to have the substantially same arrangement and substantially the same shapes as the plurality of first bonding pads PAD1, and may be bonded to the plurality of first bonding pads PAD1, respectively. Each of the plurality of third bonding pads PAD3 may be coupled to a pad region of a corresponding electrode layer 20 through a contact CNT4.

The plurality of fourth bonding pads PAD4 may be configured to have the substantially same arrangement and substantially the same shapes as the plurality of second bonding pads PAD2, and may be bonded to the plurality of second bonding pads PAD2, respectively. Although the second bonding pads PAD2 and the fourth bonding pads PAD4 do not actually exist in the cross-section illustrated in FIG. 2, they are included in order to facilitate understanding, and are shown by dotted lines.

A wiring line W may be disposed over the source plate 12. The wiring line W may be disposed to be spaced apart from the plurality of fourth bonding pads PAD4, with the electrode layers 20 interposed therebetween.

Although not illustrated, the cell wafer CW may include a plurality of pins for interfacing with an external device. The plurality of pins may include a power pin, and the wiring line W may be a power line that is coupled to the power pin. The wiring line W may be coupled to the plurality of fourth bonding pads PAD4 through vertical contacts (not illustrated).

When the first and second bonding pads PAD1 and PAD2 of the peripheral wafer PW and the third and fourth bonding pads PAD3 and PAD4 of the cell wafer CW are overlapped and bonded, a pad bonding failure may occur.

A pad bonding failure means that, when overlapped and bonded, the first and second bonding pads PAD1 and PAD2 of the peripheral wafer PW and the third and fourth bonding pads PAD3 and PAD4 of the cell wafer CW do not overlapped as intended such that a bonding pad is not bonded to its corresponding bonding pad (an open failure) or a bonding pad is bonded to the wrong adjacent bonding pad (a short failure).

If the size of a bonding pad is increased, the margin increases within which to dispose the bonding pad so that it overlaps with a target bonding pad, and thus, the possibility of an occurrence of an open failure will decrease. However, if the size of a bonding pad is increased, an interval between adjacent bonding pads decreases, and so the probability for a bonding pad to overlap with an undesired bonding pad increases and the possibility of an occurrence of a short failure increases. Conversely, if the size of a bonding pad is reduced so that an interval between adjacent bonding pads is increased, then the possibility of the occurrence of a short failure may be reduced, but the possibility of the occurrence of an open failure may increase due to a reduction in the size of the bonding pad.

If the size of a bonding pad is increased and an interval between adjacent bonding pads is increased, then the possibility of both an open failure and a short failure may be reduced, but the size of the semiconductor device increases, which does not support miniaturization. Embodiments herein disclose measures capable of reducing a pad bonding failure without increasing the size of a semiconductor device.

Figure 3:
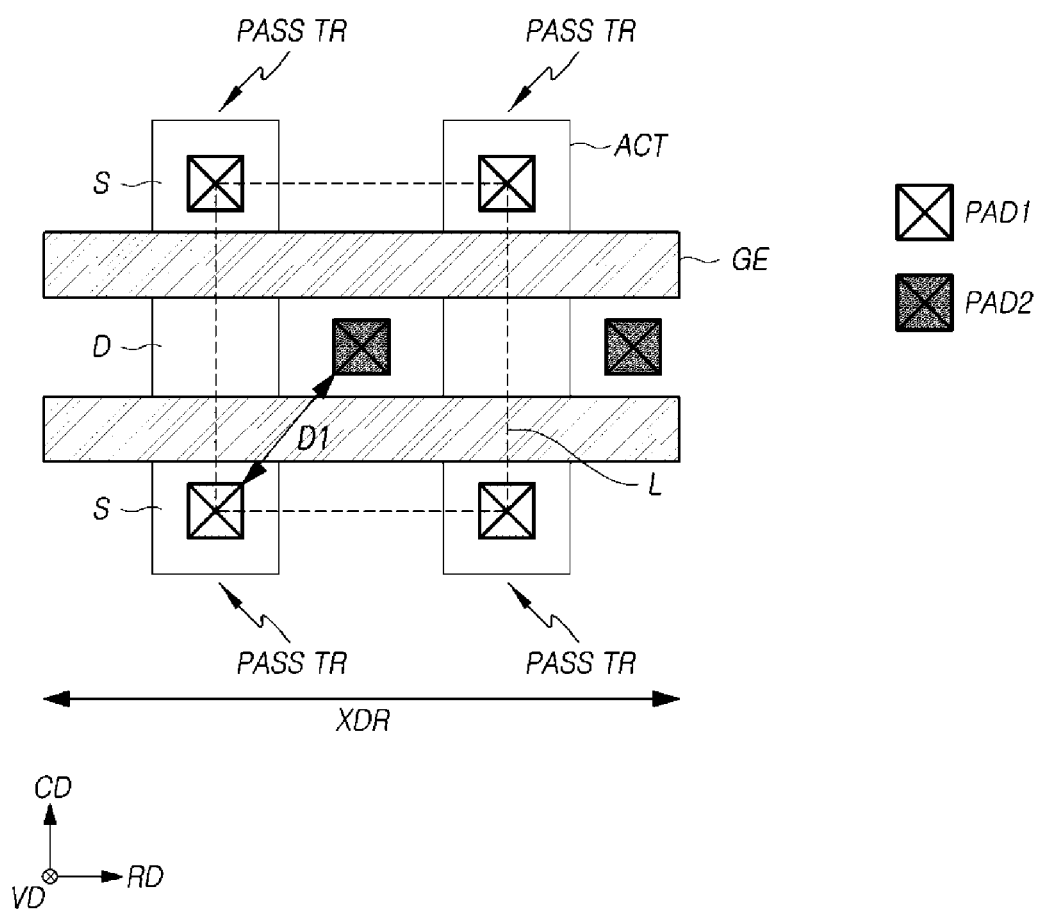
FIG. 3 is an exemplary layout diagram illustrating a layout of pass transistors and bonding pads in accordance with an embodiment of the disclosure.

FIG. 3 is an exemplary layout diagram illustrating a layout of pass transistors and bonding pads in accordance with an embodiment of the disclosure.

Referring to FIG. 3, in a row decoder region XDR, a plurality of pass transistors PASS TR may be arranged in the row direction RD and the column direction CD.

In detail, a plurality of active regions ACT may be disposed in a line in the row direction RD, and two gate lines GE, which extend in the row direction RD, may be disposed parallel to each other while traversing the plurality of active regions ACT which are disposed in a line in the row direction RD.

A drain region D may be formed in the center portion of each active region ACT between the two gate lines GE, and two source regions S may be formed in both end portions, respectively, of the active region ACT, which are positioned opposite to the drain region D with respect to the gate lines GE. Accordingly, two transistors that share one drain region D may be configured in one active region ACT. Each of the pass transistors PASS TR may be one of two transistors which are configured in one active region ACT.

Although FIG. 3 illustrates only two rows of pass transistors PASS TR that are configured in active regions ACT disposed in one row, it should be understood that active regions ACT may be provided in a plurality of rows, and pass transistors PASS TR may be provided in rows that number twice the number of rows of the active regions ACT.

In the row decoder region XDR, a plurality of first bonding pads PAD1 and a plurality of second bonding pads PAD2 may be disposed. The plurality of first bonding pads PAD1 may be disposed in a plurality of rows. The plurality of second bonding pads PAD2 may be disposed in a row that is different from the rows of the first bonding pads PAD1, and may be disposed by being offset with respect to the first bonding pads PAD1 in the row direction RD. For example, the first bonding pads PAD1 in a row and the second bonding pads PAD2 in an adjacent row may be disposed in a zigzag style extending in the row direction RD.

In a layout, the first bonding pads PAD1 may have the same or substantially the same arrangement structure as the source regions S of the pass transistors PASS TR. For example, in the same manner as the source regions S are disposed in a plurality of rows, the plurality of first bonding pads PAD1 may also be disposed in a plurality of rows.

The plurality of first bonding pads PAD1 may overlap with the source regions S, respectively, of the pass transistors PASS TR in the vertical direction VD. A first bonding pad PAD1 and a source region S that overlap in the vertical direction VD may be coupled to each other through an electrical coupling path (not illustrated). The electrical coupling path that couples the first bonding pad PAD1 and the source region S may be configured to have the same length as a shortest distance between the first bonding pad PAD1 and the source region S, which are disposed to overlap in the vertical direction VD.

When viewed from the top, each of the plurality of second bonding pads PAD2 may be disposed in the same or substantially the same row as the drain regions D of the pass transistors PASS TR. The plurality of second bonding pads PAD2 may be offset with respect to the drain regions D in the row direction RD. Because the drain regions D are not offset with respect to the first bonding pads PAD1 in the row direction RD, if each of the second bonding pads PAD2 is offset with respect to the drain regions D in the row direction RD, then it may be understood that each of the second bonding pads PAD2 is also offset with respect to the first bonding pads PAD1 in the row direction RD.

Stated otherwise, a second bonding pad PAD2 may be disposed at the center portion of a quadrangular region surrounded by virtual lines L, which connect four first bonding pads PAD1 that are adjacent in the row direction RD and the column direction CD. For example, the second bonding pad PAD2 may be disposed at a point where two diagonal lines, which couple vertices of the quadrangular region defined by the virtual lines L, intersect with each other, and the interval between the first bonding pad PAD1 and the adjacent corresponding second bonding pad PAD2 may have a size of D1. In this example, the vertices may be located at the center of each first bonding pad PAD1, however, other locations that reference first bonding pad PAD1 are also possible.

Figure 4:
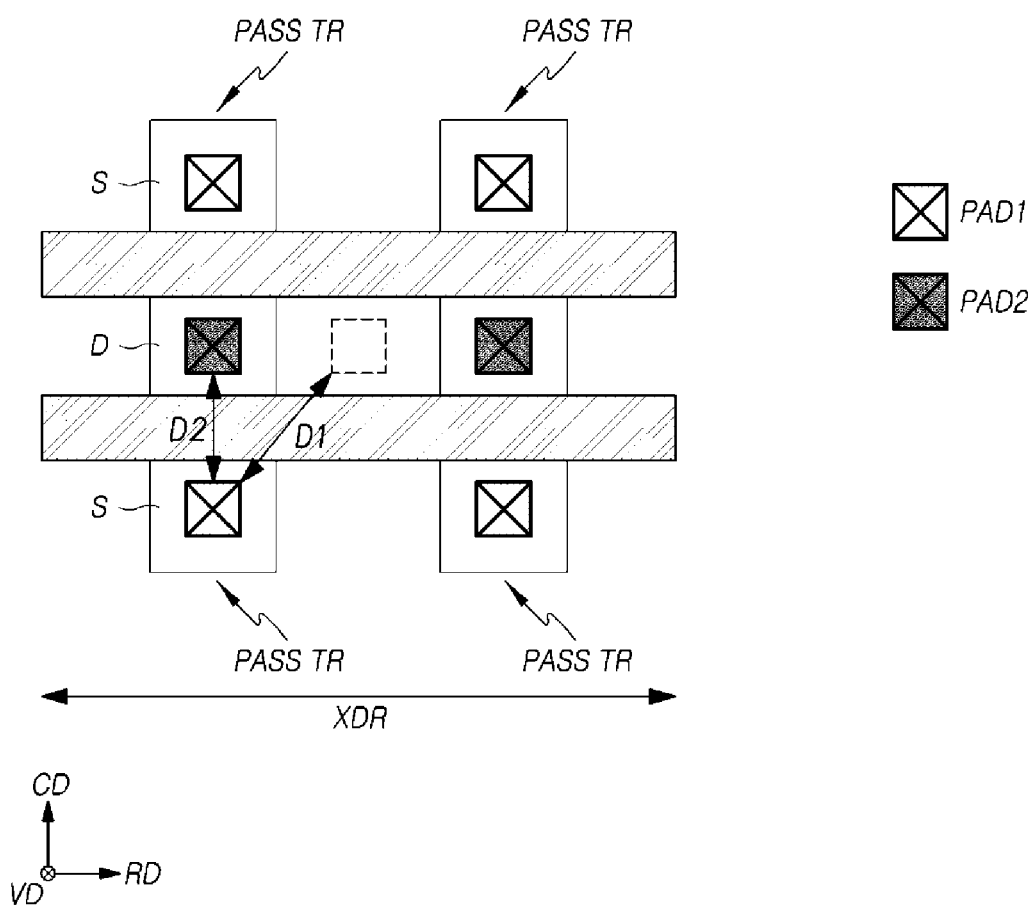
FIG. 4 is a layout diagram illustrating a layout of pass transistors and bonding pads different from that compared to an embodiment of the disclosure.

FIG. 4 is a layout diagram illustrating a layout of pass transistors and bonding pads different that compared to an embodiment of the disclosure.

Referring to FIG. 4, a second bonding pad PAD2 may be positioned between two first bonding pads PAD1, which are adjacent to each other in the column direction CD. The second bonding pad PAD2 is not offset with respect to first bonding pads PAD1 in the row direction RD, so the second bonding pad PAD2 may be positioned between the two first bonding pads PAD1 that are adjacent to each other in the column direction CD. In FIG. 4, the interval between the first bonding pad PAD1 and the second bonding pad PAD2 that are adjacent to each other is D2, which is smaller than D1.

As in an embodiment of the disclosure described above with reference to FIG. 3, if the second bonding pads PAD2 are disposed to be offset with respect to the first bonding pads PAD1 in the row direction RD, then the interval between the first bonding pad PAD1 and the second bonding pad PAD2 adjacent to each other may be increased as compared to the case in FIG. 4, where the second bonding pads PAD2 are disposed without being offset with respect to the first bonding pads PAD1 in the row direction RD. Therefore, in FIG. 3, when first and second bonding pads (PAD1 and PAD2 of FIG. 2) of a peripheral wafer (PW of FIG. 2) and third and fourth bonding pads (PAD3 and PAD4 of FIG. 2) of a cell wafer (CW of FIG. 2) are overlapped and bonded, it is possible to reduce the possibility of the occurrence of a pad bonding failure.

Part (a) of FIG. 5 is a diagram illustrating a column-directional layout structure of bonding pads that is different compared to an embodiment of the disclosure, and part (b) of FIG. 5 is a diagram illustrating a column-directional layout structure of bonding pads in accordance with an embodiment of the disclosure.

As described above with reference to FIG. 4, second bonding pads PAD2 may be disposed without being offset with respect to first bonding pads PAD1 in the row direction RD. As illustrated in part (a) of FIG. 5, the second bonding pad PAD2 of FIG. 4 may be positioned between two first bonding pads PAD1, which are adjacent to each other in the column direction CD.

As described above with reference to FIG. 3, according to an embodiment of the disclosure, the second bonding pads PAD2 are disposed by being offset with respect to the first bonding pads PAD1 in the row direction RD. As a result, the second bonding pads PAD2 are disposed in a column different from columns in which the first bonding pads PAD1 are disposed. As illustrated in part (b) of FIG. 5, the second bonding pad PAD2 is not positioned between the first bonding pads PAD1, which are adjacent to each other, in the column direction CD. Thus, the interval between adjacent bonding pads PAD1 and PAD2 is increased in comparison to the case illustrated in part (a) of FIG. 5.

FIG. 6 is a layout diagram illustrating pass transistors and bonding pads in accordance with another embodiment of the disclosure.

Referring to FIG. 6, each of first bonding pads PAD1 and second bonding pads PAD2 may have a polygonal shape. For example, a side of the first bonding pad PAD1 and a side of the second bonding pad PAD2 that face each other may be parallel to each other.

The shape of each of the first bonding pads PAD1 and the second bonding pads PAD2 may be a polygon, and in a layout view, the sides of the polygon may each form an angle to a row direction RD or a column direction CD. The formed angles may vary and may be angles other than 90 degrees and 180 degrees with respect to the row direction RD and the column direction CD. That is to say, the shape of each of the first bonding pads PAD1 and the second bonding pads PAD2 may be a polygon that is realized such that each of the sides thereof is not vertical and is not horizontal with respect to, or parallel to, the row direction RD and the column direction CD. For example, a polygon having such a shape may be a rhombus in which each side forms an acute or obtuse angle with respect to the row direction and the column direction. For other example, a shape of each of first bonding pads PAD1 and the second bonding pads PAD2 is a square polygon, and a side of one of the second bonding pads PAD2 is rotated by forty-five (45) degrees to a closest side of an adjacent one of the first bonding pad PAD1.

In this manner, if the shape of each of the first and second bonding pads PAD1 and PAD2 is realized such that a side of the first bonding pad PAD1 and a side of the second bonding pad PAD2 that are closest to each other are also parallel to each other, then the interval between the first bonding pad PAD1 and the second bonding pad PAD2, which are adjacent to each other, may be increased to D3 even without reducing the sizes of the first and second bonding pads PAD1 and PAD2.

According to the present embodiment of the disclosure, the interval between the first bonding pad PAD1 and the second bonding pad PAD2 that are adjacent to each other may be additionally increased by changing the shape of each of the first and second bonding pads PAD1 and PAD2 without changing the sizes or areas of the first and second bonding pads PAD1 and PAD2, which makes it possible to further reduce the possibility of the occurrence of a pad bonding failure.

FIG. 7 is a cross-sectional view illustrating a semiconductor device in accordance with another embodiment of the disclosure. Elements not fully described below are substantially the same as the identical elements described above with reference to FIG. 2.

Referring to FIG. 7, in a row decoder region XDR, a plurality of vertical contacts CNT5, which couple a wiring line W and a plurality of fourth bonding pads PAD4, may be positioned. The plurality of fourth bonding pads PAD4 may be disposed only in the row decoder region XDR, not in the peripheral region PR. The plurality of second bonding pads PAD2 bonded to the plurality of fourth bonding pads PAD4 may be also be disposed only in the row decoder region XDR, not in the peripheral region PR.

A cell wafer CW may include a power pin (not illustrated) for receiving a power voltage from an external device, and the wiring line W may be a power line that is coupled to the power pin.

The vertical contacts CNT5 may pass through a source plate 12, a plurality of electrode layers 20 and a plurality of interlayer dielectric layers 22 in the vertical direction VD in the row decoder region XDR. The vertical contacts CNT5 may be disposed only in the row decoder region XDR, not in the peripheral region PR. In order to insulate the source plate 12 and the plurality of electrode layers 20 from the vertical contacts CNT5, a dielectric layer may be formed to surround the vertical contacts CNT5.

Each of the vertical contacts CNT5 may be configured to have a shape that extends in the vertical direction VD and that is at a position overlapping with a corresponding fourth bonding pad PAD4. Accordingly, each vertical contact CNT5 may be configured to have the same or substantially the same length as a shortest distance between the corresponding fourth bonding pad PAD4 and the wiring line W.

Although FIG. 7 illustrates in which each vertical contact CNT5 is formed as one via, it is to be noted that the disclosure is not limited thereto. The vertical contacts CNT5 may be formed as a plurality of vias that are coupled to one another and are disposed in a line in the vertical direction VD.

FIG. 8 is a view illustrating a layout of bonding pads and vertical contacts different from that in accordance with an embodiment of the disclosure. Elements not fully described below are substantially the same as the identical elements described above with reference to FIG. 2 and FIG. 7.

Referring to FIG. 8, fourth bonding pads PAD4 and vertical contacts CNT5 may be disposed in a peripheral region PR. The peripheral region PR is a region that is not used for disposing pass transistors PASS TR, and thus, in order to reduce the size of a semiconductor device, it is necessary to reduce the area of the peripheral region PR.

As illustrated in FIG. 8, if the fourth bonding pads PAD4 and the vertical contacts CNT5 are disposed in the peripheral region PR, then the area of the peripheral region PR may increase due to an area that is occupied by the fourth bonding pads PAD4 and the vertical contacts CNT5, thereby resulting in an increase in the size of a semiconductor device.

As in an embodiment of the disclosure described above with reference to FIG. 7, if the fourth bonding pads PAD4 and the vertical contacts CNT5 are disposed in the row decoder region XDR, which is utilized for disposing the pass transistors PASS TR, then it is not necessary to consume a separate area so as to dispose the fourth bonding pads PAD4 and the vertical contacts CNT5, which makes it possible to reduce the size of a semiconductor device.

FIG. 9 is a block diagram schematically illustrating a memory system including a semiconductor device in accordance with an embodiment of the disclosure.

Referring to FIG. 9, a memory system 600 in accordance with an embodiment may include a nonvolatile memory device (NVM Device) 610 and a memory controller 620.

The nonvolatile memory device (NVM Device) 610 may be constituted by a semiconductor device described above and may operate in the manner described above. The memory controller 620 may be configured to control the nonvolatile memory device (NVM Device) 610. By the combination of the nonvolatile memory device (NVM Device) 610 and the memory controller 620, a memory card or a solid state disk (SSD) may be provided. An SRAM 621 is used as a working memory of a processing unit (CPU) 622. A host interface (Host I/F) 623 includes a data exchange protocol of a host, which is coupled with the memory system 600.

An error correction code block (ECC) 624 detects and corrects an error included in data read from the nonvolatile memory device (NVM Device) 610.

A memory interface (Memory I/F) 625 interfaces with the nonvolatile memory device (NVM Device) 610 of the present embodiment. The processing unit (CPU) 622 performs general control operations for data exchange of the memory controller 620.

Although not shown in the drawing, it is obvious to a person skilled in the art to which the embodiment pertains that the memory system 600 in accordance with the embodiment may be additionally provided with a ROM which stores code data for interfacing with the host. The nonvolatile memory device (NVM Device) 610 may be provided as a multi-chip package which is constituted by a plurality of flash memory chips.

The memory system 600 in accordance with the embodiment, described above, may be provided as a storage medium of high reliability, which has a low probability of an error to occur. In particular, the nonvolatile memory device of the present embodiment may be included in a memory system such as a solid state disk (SSD) which is being actively studied recently. In this case, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Drive Electronics) protocol.

FIG. 10 is a block diagram schematically illustrating a computing system including a semiconductor device in accordance with an embodiment of the disclosure.

Referring to FIG. 10, a computing system 700 in accordance with an embodiment may include a memory system 710, a microprocessor (CPU) 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, an OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted by the appended claims and encompass all equivalents falling within the scope of the appended claims.

What is claimed is:

1. A semiconductor device comprising:
    a first wafer including a row decoder region in which a plurality of pass transistors are arranged in a row direction and a column direction;
    a plurality of first bonding pads, respectively coupled to the plurality of pass transistors and disposed in a plurality of rows on one surface of the first wafer in the row decoder region; and
    a plurality of second bonding pads disposed on the one surface of the first wafer in the row decoder region,
    wherein the plurality of second bonding pads are disposed in a different row from the plurality of first bonding pads and are offset in the row direction with respect to the plurality of first bonding pads.

2. The semiconductor device according to claim 1, wherein the plurality of second bonding pads include a power pad that is used to transfer power.

3. The semiconductor device according to claim 1, wherein each of the plurality of first bonding pads is disposed to overlap, in a vertical direction, with a source region of a corresponding pass transistor.

4. The semiconductor device according to claim 1, further comprising a plurality of active regions,
    wherein a pair of pass transistors from the plurality of pass transistors are disposed in a corresponding one of the plurality of active regions and share one drain region,
    wherein two first bonding pads, from among the plurality of first bonding pads, that are adjacent to each other in the column direction are disposed to overlap, in a vertical direction, with two respective source regions of the pair of pass transistors that share one drain region, and
    wherein, from a top view, one of the plurality of second bonding pads is disposed to be offset with respect to the drain region in the row direction.

5. The semiconductor device according to claim 1, wherein four first bonding pads from among the plurality of first bonding pads form, from a top view, a quadrangular region and one of the plurality of second bonding pads is disposed at a center portion of the quadrangular region.

6. The semiconductor device according to claim 1, wherein a shape, from a top view, of each of the plurality of first bonding pads and the plurality of second bonding pads is a rhombus shape in which each side forms an acute or obtuse angle with respect to the row direction and the column direction.

7. The semiconductor device according to claim 1, wherein a shape of each of the plurality of first bonding pads and the plurality of second bonding pads is a polygon, and a side of one of the plurality of first bonding pads and a closest side of an adjacent one of the plurality of second bonding pads are parallel to each other.

8. The semiconductor device according to claim 1, further comprising:
   a second wafer bonded to the one surface of the first wafer,
   wherein the second wafer comprises:
   a memory cell array defined in a cell region;
   a plurality of electrode layers, extending to the row decoder region from the cell region, that are stacked in a vertical direction and coupled to the memory cell array;
   a plurality of third bonding pads, coupled to the plurality of electrode layers, respectively, having the same arrangement structure as the plurality of first bonding pads and bonded to the plurality of first bonding pads, respectively;
   a plurality of fourth bonding pads, having the same arrangement structure as the plurality of second bonding pads and bonded to the plurality of second bonding pads, respectively; and
   a wiring line coupled to the plurality of fourth bonding pads.

9. The semiconductor device according to claim 8, wherein the wiring line includes a power line.

10. A semiconductor device comprising:
   a cell wafer including a plurality of electrode layers that are stacked one upon another in a vertical direction on a bottom surface of a source plate, and a plurality of vertical channels passing through the plurality of electrode layers to the source plate in a cell region, wherein the plurality of electrode layers extend to a row decoder region from the cell region;
   a plurality of first bonding pads disposed on one surface of the cell wafer in the row decoder region, and coupled to the plurality of electrode layers, respectively;
   a plurality of second bonding pads disposed on the one surface of the cell wafer in the row decoder region;
   a wiring line in the cell wafer, disposed over a top surface of the source plate and separated from the vertical channels, wherein the wiring line is spaced apart from the second bonding pads in the vertical direction, with the plurality of electrode layers and the source plate interposed therebetween; and
   a plurality of vertical contacts disposed in the row decoder region, that respectively couples the plurality of second bonding pads to the wiring line,
   wherein the plurality of first bonding pads and the plurality of second bonding pads are disposed in the cell wafer.

11. The semiconductor device according to claim 10, wherein the wiring line includes a power line.

12. The semiconductor device according to claim 10, further comprising:
   a peripheral wafer bonded to the one surface of the cell wafer,
   wherein the peripheral wafer comprises:
   a plurality of pass transistors arranged in a row direction and a column direction in the row decoder region;
   a plurality of third bonding pads coupled to the plurality of pass transistors, respectively, and bonded to the plurality of first bonding pads, respectively; and
   a plurality of fourth bonding pads bonded to the plurality of second bonding pads, respectively.

13. The semiconductor device according to claim 12, wherein the third bonding pads are disposed in a plurality of rows, and
   wherein each of the plurality of fourth bonding pads is disposed in a different row from the plurality of third bonding pads, and the plurality of fourth bonding pads are offset in the row direction with respect to the plurality of third bonding pads.

14. The semiconductor device according to claim 13, wherein from a top view, one of the plurality of fourth bonding pads is disposed at a center portion of a quadrangular region defined by a line coupling four from among the plurality of third bonding pads that are adjacent to one another in the row direction and the column direction.

15. The semiconductor device according to claim 13, wherein a shape of each of the plurality of third bonding pads and the plurality of fourth bonding pads is a rhombus shape each side of which forms an acute or obtuse angle to the row direction and the column direction.

16. The semiconductor device according to claim 13, wherein a shape of each of the plurality of third bonding pads and the fourth bonding pads is a polygon such that a side of a third bonding pad and a side of a fourth bonding pad that face each other are also parallel to each other.

17. The semiconductor device according to claim 4, wherein a shape of each of the plurality of first bonding pads and the plurality of second bonding pads is a square polygon, and a side of one of the plurality of second bonding pads is rotated by forty-five (45) degrees to a closest side of an adjacent one of the plurality of first bonding pads.

18. The semiconductor device according to claim 8, wherein the second wafer further comprises a peripheral region, and the plurality of fourth bonding pads and the plurality of second bonding pads are not disposed in the peripheral region.

19. The semiconductor device according to claim 10, wherein the plurality of vertical contacts directly couple the plurality of second bonding pads and the wiring line in the shortest distance.

20. The semiconductor device according to claim 10, wherein the cell wafer further comprises a peripheral region, and wherein the plurality of second bonding pads and the plurality of vertical contacts that couple the wiring line to the plurality of second bonding pads, are not disposed in the peripheral region.

* * * * *